(12) United States Patent
Lefort et al.

(10) Patent No.: US 6,251,698 B1
(45) Date of Patent: Jun. 26, 2001

(54) METHOD FOR MAKING A MACHINED SILICON MICRO-SENSOR

(75) Inventors: Olivier Lefort; Isabelle Thomas, both of Valence (FR)

(73) Assignee: Sextant Avionique, Velizy Villacoublay (FR)

(*) Notice: Subject to any disclaimer, the term of this patent is extended or adjusted under 35 U.S.C. 154(b) by 0 days.

(21) Appl. No.: 09/424,223

(22) PCT Filed: May 19, 1998

(86) PCT No.: PCT/FR98/00998

§ 371 Date: Nov. 23, 1998

§ 102(e) Date: Nov. 23, 1999

(87) PCT Pub. No.: WO98/53483

PCT Pub. Date: Nov. 26, 1998

(30) Foreign Application Priority Data

May 23, 1997 (FR) .................................................. 97 06333

(51) Int. Cl.[7] .................................................... H01L 21/00
(52) U.S. Cl. .................................. 438/22; 438/24; 438/26; 438/48; 438/51; 438/53
(58) Field of Search .................................. 438/22, 24, 26, 438/48, 51, 53

(56) References Cited

U.S. PATENT DOCUMENTS 5,305,643 * 4/1994 Thomas et al. .
5,510,276 * 4/1996 Diem et al. .

* cited by examiner

Primary Examiner—Kevin M. Picardat
Assistant Examiner—D. M. Collins
(74) Attorney, Agent, or Firm—Oblon, Spivak, McClelland, Maier & Neustadt, P.C.

(57) ABSTRACT

A process for the production of microsensors machined in silicon, and in particular accelerometers for applications of assisting with navigation in aircraft, and pressure sensors. In order to improve the production of certain active parts of the sensor, and in particular of a beam forming a resonator, which needs to have well-controlled width and thickness characteristics, the following procedure is adopted. A beam having a thickness equal to the desired final thickness, and a width greater than the desired final width, is produced by micromachining the silicon on a first plate, the beam being covered on its upper face by a mask defining the desired final width. The plate is assembled with another plate. The two faces of the beam are oxidized in order to cover them with a thin protective layer. The thin protective layer on the upper face is removed, by vertical directional etching, without removing the mask already present. The silicon in the area exposed by the preceding operation is attacked by a vertical directional etch on the upper face, until the entire part of the beam not protected by the mask is eliminated, and the beam having the desired width is thus formed.

10 Claims, 11 Drawing Sheets

LOWER PLATE 10

AREA FACING THE RESONATOR    AREA FACING THE PROOF MASS

UPPER STOPS

UPPER PLATE 20

UPPER PLATE 20

CENTRAL PLATE 30

CENTRAL PLATE 30

LOWER PLATE + CENTRAL PLATE

ASSEMBLING THREE PLATES TOGETHER

METHOD FOR MAKING A MACHINED SILICON MICRO-SENSOR

BACKGROUND OF THE INVENTION

1. Field of the Invention

The invention relates to the production of microsensors machined in silicon, in particular accelerometers for applications of assisting with navigation in aircraft, and pressure sensors.

2. Discussion of the Background

Various embodiments of such sensors have already been proposed in the art, and in particular sensors produced by superposition of three silicon plates assembled together by bonding or welding, the plates being machined partly before assembly and partly after assembly. The central plate has directly active mechanical elements, that is to say on which the acceleration is exerted in the case of an accelerometer, the pressure in the case of a pressure sensor; it also has electrical elements needed for its operation. The upper and lower plates frame the central plate and, where appropriate, carry the electrical elements needed for its operation, in addition to the electrical elements of the central plate (in particular electrical connections).

One of the main problems which are posed in the fabrication of these sensors is the etching of certain elements of the central plate, and most particularly elements which require high micromachining precision because of their role in the sensor.

This is the case, in particular, with the moving suspension elements of the microsensor, that is to say the mechanical elements which undergo movements or stresses as a function of the parameters which it is desired to measure (accelerations, pressure etc.).

Typically, in an accelerometer having a sensitive mass attached to a fixed framework by suspension elements and a resonant beam, the problem resides in the etching of the suspension elements and of the resonant beam. Similarly, in a pressure sensor having a thin plate experiencing a pressure and transmitting its deformations to the ends of a resonant beam, the problem resides above all in the etching of the resonant beam and of the elements through which it is connected to the thin plate.

In order to obtain sufficient etching precision in terms of the widths and thicknesses of these beams, it is currently necessary to resort to complex silicon-plate structures, with silicon oxide layers integrated in the thickness of the plate (structures with multiple epitaxy or structures with implanted oxide layers), which is expensive. Otherwise, the etching is not precise enough, although the performance of the sensor does in fact depend on the etching precision. It has been found, for example, that the precision with which the beam is etched is not sufficient when the beam is etched by chemical attack on its two faces through a mask deposited on one face.

Lastly, in general, the machining of the elements of the central plate is made particularly difficult because, further to the etching of the active elements, it is necessary to provide other etches, including very deep etches which may extend as far as full separation of an active central area from a peripheral frame, these deep etches having to be carried out without compromising the partial etches of the active elements. The result of this is that the fabrication process has to take a large number of constraints into account, and the object of the present invention is to propose to carry out certain fabrication steps in an advantageous way while being compatible with the many other steps which need to be performed in order to obtain an operational sensor.

SUMMARY OF THE INVENTION

In order to find an effective compromise between the problems of precision, of compatibility with the various micromachining operations, and of fabrication cost, the present invention provides a process for micromachining a beam of a microsensor having at least two plates, at least the first of which is in micromachined silicon, this process being characterized in that:

a beam having a thickness equal to the desired final thickness, and a width greater than the desired final width, is produced by micromachining the silicon on the first plate, the beam being covered on its upper face by a mask defining the desired final width;

the two plates are assembled together;

the two faces of the beam are oxidized in order to cover them with a thin protective layer;

this thin protective layer on the upper face is removed, by vertical directional etching, without removing the mask already present;

the silicon in the area exposed by the preceding operation is attacked by means of an etch through the upper face, until the entire part of the beam not protected by the mask is eliminated, and the beam having the desired width is thus formed.

At this stage, it is possible to remove the protective layer and the preceding mask, which is moreover in silicon oxide like the protective layer.

Among the advantages of the process according to the invention, it may be noted that, in the case when the etching of the protective layer needs to be carried out in the presence of a mask (and this is the case when it is desired for elements other than the suspension elements to be protected during the attack on the silicon), it is easier to put this mask on the assembled plates than on a single plate which has been weakened by significant thickness reductions.

Furthermore, in the case when the active elements etched on the first plate are surrounded by a spacer frame which is physically separated from the active elements but is machined from the same plate, temporary attachments are kept between the frame and the active elements, until the two plates are assembled together, and these temporary attachments are not eliminated until after assembly, during the operation of directional attack on the silicon.

In practice, before the plates are assembled together, machining of the beam comprises the following operations:

depositing a layer which protects against etching of the silicon over a width greater than the width of the beam desired, this layer being thicker over a width corresponding to the final width desired for the beam;

attacking the silicon through both the upper face and the lower face in one or more steps, until the beam is given the desired final thickness;

removing the protective layer on the edges of the beam on either side of the desired final width, while keeping a portion of protective layer having the desired final width.

In the case of an accelerometer having a proof mass connected to a base not only by the beam but also by suspension arms located in the median plane of the thickness of the first plate, a first step of attacking the silicon through the upper face and the lower face is firstly carried out on the first plate alone, this first step ending when the suspension arms machined both from the top and from the bottom have reached their desired thickness; these suspension arms are then oxidized in order to protect them during the rest of the silicon attack.

BRIEF DESCRIPTION OF THE DRAWINGS

Other characteristics and advantages of the invention will become apparent on reading the detailed description which follows, and which is given with reference to the appended drawings, in which.

DESCRIPTION OF THE PREFERRED EMBODIMENTS

Figures 1, 2:
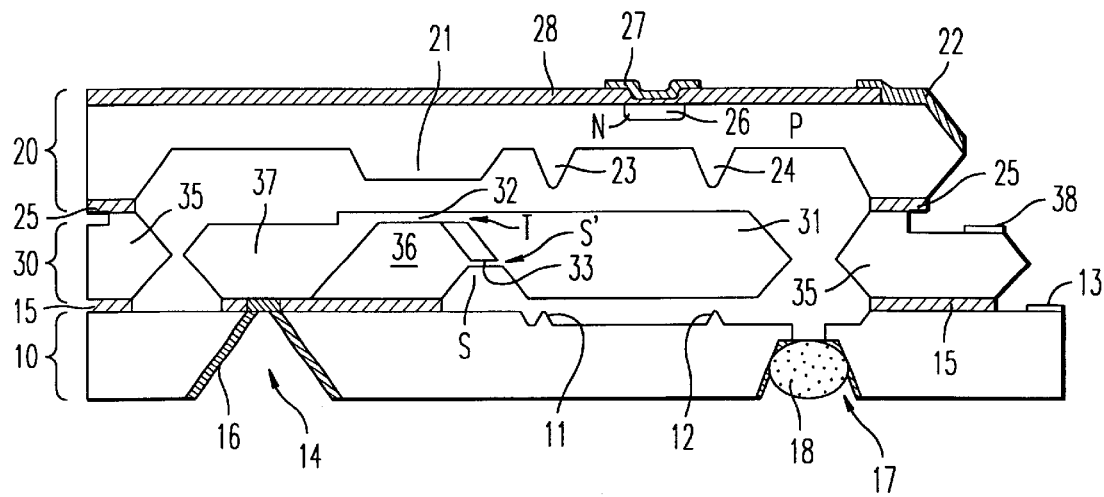
FIG. 1 represents a vertical section of an accelerometer produced using the process according to the invention.
FIG. 2 represents a horizontal top view of the central plate of the accelerometer.

The fabrication process according to the invention is applicable to a variety of micromachined silicon sensors, and will be described with reference to an accelerometer whose general structure is represented in FIGS. 1 and 2.

The accelerometer consists of the superposition of three machined conducting silicon plates, 10, 20, 30, welded together while remaining separated from one another by silicon oxide layers 15 and 25.

FIG. 2 represents a top view of the central plate 30, in which, in particular, a proof mass 31, a resonant beam 32 connected to the proof mass, and side suspension arms 33 and 34 have been machined. The central plate has a structure overall symmetrical with respect to a vertical median plane passing through the middle of the resonant beam, along the latter. The side suspension arms 33 and 34 are arranged symmetrically on either side of this symmetry plane.

The central plate 30 is in fact formed by two quite separate parts which are electrically insulated from one another and which, for this reason, have been completely separated physically from one another by etching during the fabrication of the accelerometer. The first part 35 is a continuous peripheral frame surrounding the entire second part, which is the active part 36 of the accelerometer. The peripheral frame 35 is essentially used as a connecting spacer between the lower plate 10 and the upper plate 20, for holding these two plates away from one another. It is, however, also used as electrical screening between the plates 10 and 20. The active part 36 of the central plate is entirely located between the lower and upper plates, and inside the peripheral frame 35.

The active part essentially comprises:

- a fixed base 37 welded onto the lower plate 10, and electrically connected to this plate; this base has, seen from above, a U-shape whose opening is turned towards the proof mass;

- the proof mass 31 mentioned already; its thickness if equal or almost equal to the thickness of the central plate; it is held at the base 37 by a cantilever suspension (32, 33, 34);

- the resonant beam 32, connected on one side to the proof mass and on the other to the fixed base, the connection being placed at the center of the U; its thickness is very small compared to the thickness of the proof mass; it is arranged substantially in the upper plane of the central plate so as to be fairly close to the upper plate; it actually forms a capacitor with the upper-plate portion 21 which is directly opposite the latter;

- the side suspension arms 33 and 34, which are thin horizontal sheets; they are connected-to the proof mass, on the one hand, and to the fixed base 37, on the other hand, one at the end of the first branch of the U, the other, symmetrically, at the end of the second branch of the U; their thickness is even smaller than that of the beam forming a resonator and they are preferably located in a substantially median horizontal plane of the central plate, that is to say in a plane passing virtually through the center of gravity of the proof mass.

The three silicon plates are electrically conductive, because they contribute directly to the electrical operation of the micro-accelerometer; they are preferably in heavily P-type doped silicon (boron doping). Metal contact are formed by depositing and etching (aluminium, for example) on the lower plate (contact 13 on the edge of the plate), on the peripheral frame 35 of the central plate (contact 38 on the outer edge of the frame), and on the upper plate (contact 22 on the edge of the plate), in order to connect each of these plates to a resonant electrical circuit to which the described structure is connected.

The lower plate 10 is micromachined with the following features:

- the area facing the proof mass is attacked to define stops 11, 12 precisely, for example in the form of point-like pyramids or narrow strips; these stops make it possible to prevent the beam 32 or the suspension arms 33, 34 from breaking in the event of impact or excessive acceleration in the vertical sense;

- in addition arrangements are made for an electrical contact to be made between the lower plate and the base 37 for holding the proof mass; the preferred means for this is an opening 14 hollowed in the lower plate, through its full depth and across the silicon oxide layer 15; a conductive deposit 16 is made in this opening so as to electrically connect the plate 10 and the base 37; this structure makes it possible for an electrical voltage applied to the contact 13 of the lower plate to be transmitted to the resonant beam 32 by silicon conduction, the beam then constituting a capacitor electrode directly because of its inherent conduction;

- lastly, in the case when the cavity containing the proof mass needs to be evacuated in order to limit the damping of the vibration of the resonant beam as far as possible, provision may be made to machine an opening 17 by chemical etching through the full thickness of the plate 10; this opening can be metallized then closed by a plug 18 (in indium, in particular, or alloy with low melting point) in order to seal the cavity after having evacuated it.

For its part, the upper plate 20 has the following etched parts:

in order to avoid stray capacitive coupling between the upper plate and the active part 36 of the central plate, the upper plate is deeply etched wherever it faces this active part, except of course where capacitive coupling is desired and is used to measure the acceleration, namely in the part 21 lying exactly above the suspension beam 32.

facing the proof mass, the upper plate is deeply etched, but highly localized stops 23, 24 are left to prevent the proof mass from moving too far, which would run the risk of breaking the suspension beams in the event of impact, in particular;

lastly, the upper plate is not etched facing the peripheral frame 35 of the central plate.

The accelerations experienced by the proof mass result in a varying degree of tension on the resonant beam. The capacitor formed by this beam and the upper silicon plate is placed in a resonant circuit whose resonant frequency depends on the tension exerted, and therefore on the acceleration.

In a preferred embodiment, a diode compensating for the variations in temperature is provided in the resonant circuit in which the capacitor plays a part. It is then possible to produce the diode by diffusion in one of the silicon plates, the diffusion being of the N-type if the plates are of the P-type. One easy solution consists in providing N-type diffusion, forming a diffused region 26, in the upper part of the upper plate 20, with a contact electrode 27 deposited on this diffused region 26. This contact electrode is produced by metallization (for example of aluminium) which joins (the way in which this happens cannot be seen in the figures) one edge of the upper plate in order to allow connection to the outside of the structure. The metallization is deposited above an insulating layer 28 (for example silicon oxide) which covers all the upper plate apart from the areas for contact connection with the plate and with the diffused region 26.

The steps involved in the fabrication of the sensor will now be described.

Figure 3:
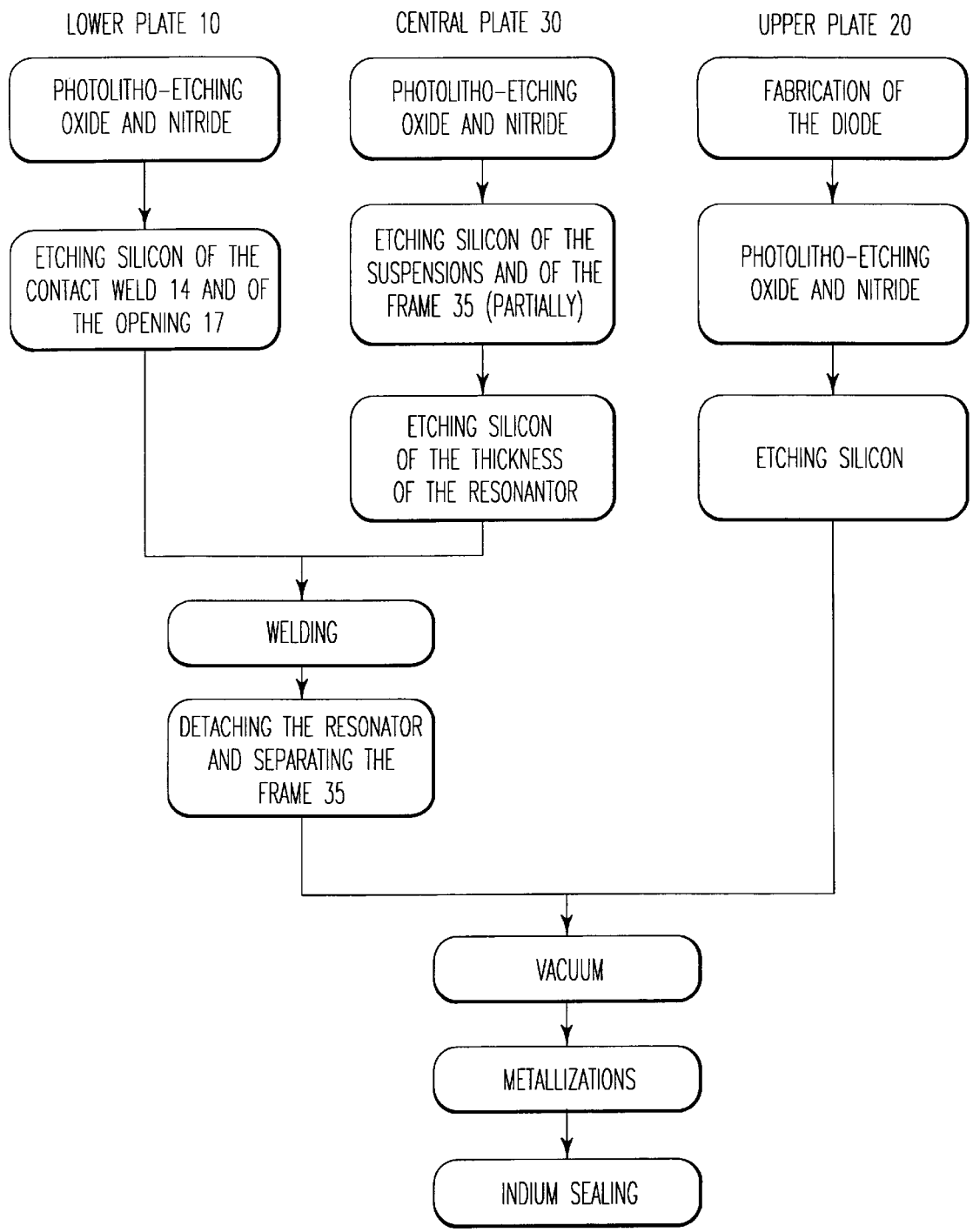
FIG. 3 represents the overall flow chart of the process for fabricating the accelerometer.

FIG. 3 represents an overall flow chart of the various fabrication steps. Certain steps are carried out separately on the lower plate, the upper plate or the central plate, before these plates are assembled together. Steps are then carried out after assembling the lower plate with the central plate. Lastly, steps are carried out after assembling all three plates together.

In general, the lower plate 10 undergoes steps of oxidation, silicon nitride deposition, photoetching of silicon oxide and silicon nitride, the silicon nitride being used as a mask for etching the oxide, then silicon etching on the upper face to define stops 11 and 12 and on the lower face in order to define openings 14 and 17.

During this time, the upper plate 20 undergoes operations of oxidation, silicon oxide etching, doping to fabricate the diode (region 26); then operations of depositing silicon nitride, photoetching silicon oxide and nitride, and successive etches of silicon on the lower face to define the stops 23, 24, and the surface of the region 21 forming a capacitor electrode.

During this time, the central plate undergoes the following operations: oxidation, silicon nitride deposition, oxide etching, successive chemical etches of silicon with successive masks, to successively define the configuration of the base 37, the proof mass 31, the suspension arms 33, 34, and the thickness of the beam 32 (but not its final width).

The lower plate and the central plate are then welded together. A final operation of etching the resonant beam and complete separation of the spacer frame 35 is then carried out.

Finally, the upper plate is welded onto the central plate, the metallizations are deposited, on the outer faces of the assembly, no metallization being necessary in the space enclosed by the upper and lower plates inside the spacer frame 35. The cavity formed in this space is hermetically closed by an indium or indium-based alloy seal.

The main fabrication operations will be described in detail with reference to FIGS. 4 and 5, as regards the lower plate, 5 and 7 as regards the upper plate, 8, 9 and 10 as regards the central plate, 11 as regards the lower and central plates assembled together, and 12 as regards all three plates assembled together. Attention will be drawn to the fact that, in FIGS. 4 to 11, various areas undergoing a variety of operations have been juxtaposed without placing these areas in their real configuration relative to one another, this being in order to simplify the description of the process.

Figure 4A:
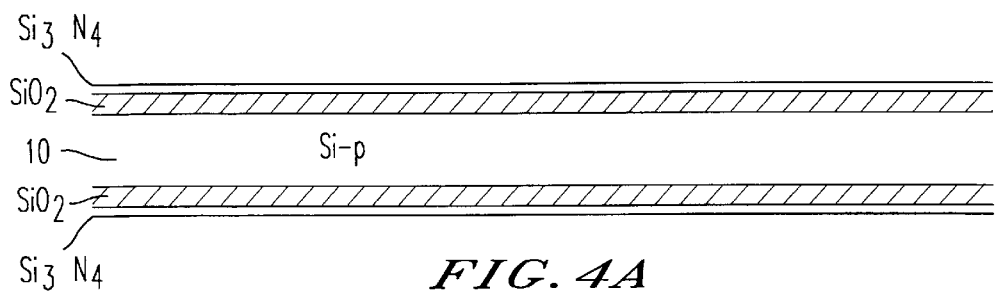
FIGS. 4 and 5 represent the successive steps of fabricating the lower silicon plate.

Lower plate 10:

A silicon oxide layer with a thickness of one or more micrometers is grown on the two faces of the lower silicon plate 10, and is itself covered with a thin layer of silicon nitride (FIG. 4a).

Figure 4B:
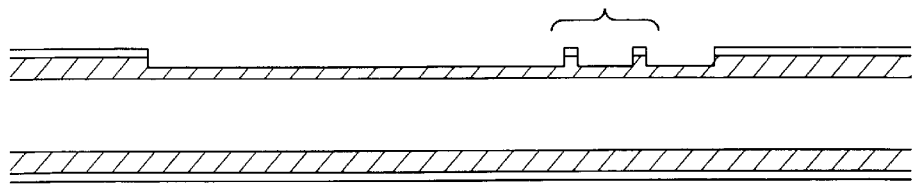

The nitride layer of the upper face is etched in a pattern defining the area facing the proof mass, keeping the nitride at the position of the lower stops 11, 12 in FIG. 1; and the oxide is attacked through a part of its depth where the nitride has been removed (FIG. 4b).

Figure 4C:

The nitride layer of the lower face is etched in a pattern defining the opening 17, and the oxide is attacked through a part of its depth in this pattern (FIG. 4c).

Figure 4D:

The nitride is again etched on the lower face in a pattern defining the contact opening 14, and the oxide is completely removed in this region, while having previously masked the opening 17 and the upper face of the wafer in order to keep the oxide there (FIG. 4d).

Figure 4E:
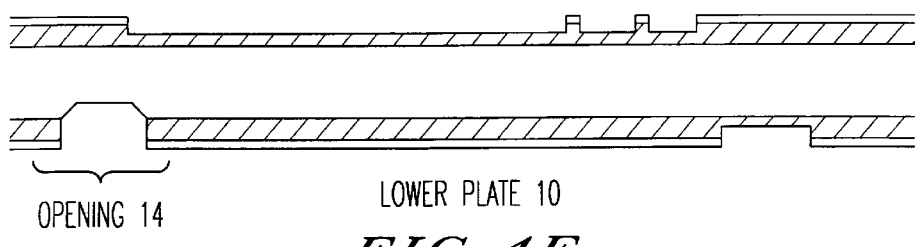

The silicon is attacked through a depth of several tens of micrometers in the opening 14 (FIG. 4e).

In general, the attacks on silicon are carried out by chemical means, which produces oblique edges, except when it is indicated that the etch is a vertical directional etch.

Figure 5A:
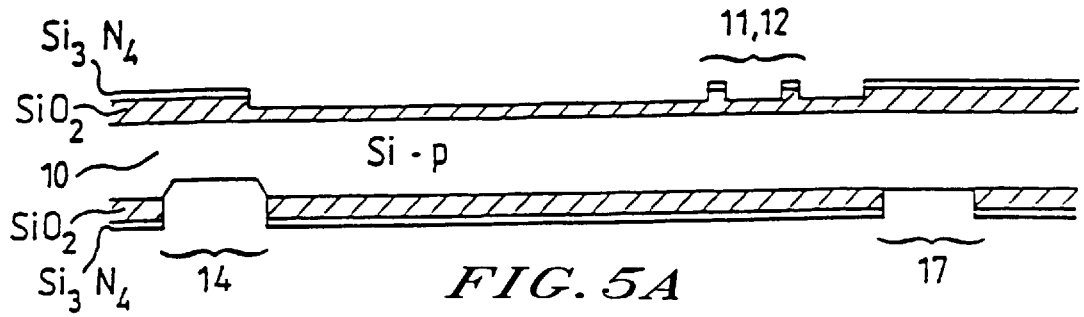
Figure 5B:
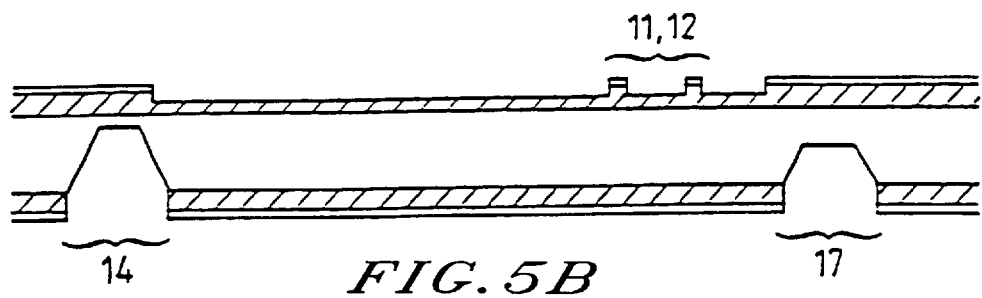

The oxide in the opening 17 is then removed (FIG. 5a), and the silicon is again attacked until a thickness of only a few tens of micrometers is left at the opening 17, and even less in the opening 14 which was already partially hollowed (FIG. 5b).

Figure 5C:
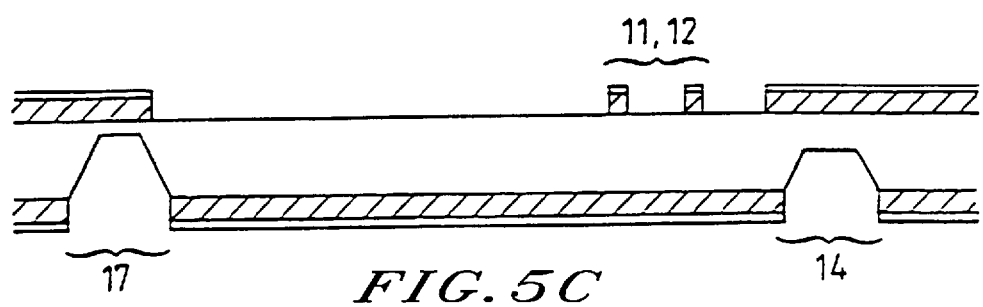

What remains of the silicon oxide not protected by the nitride on the upper face is then removed (FIG. 5c).

Figure 5D:
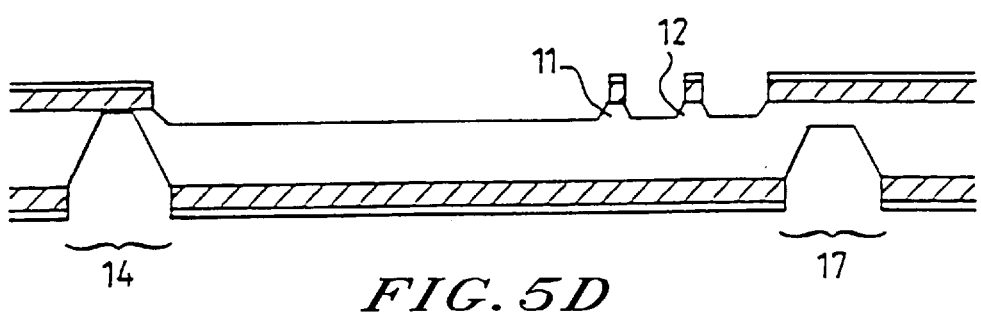

The silicon is again attacked where it is no longer protected by the oxide, namely facing the proof mass (apart from the stops) on the upper face, and in the openings 14 and 17 on the lower face. The attack on the silicon in the opening 14 takes place as far as the upper face, and stops under the oxide which covers this face. The stops 11, 12 are defined on the upper face. The opening 17 is not completely pierced at this stage (FIG. 5d).

Figure 5E:

The nitride is completely removed on the two faces, and the lower plate is ready to be assembled with the central plate (FIG. 5e).

Upper plate 20:

The operations relating to the upper plate alone are represented in FIGS. 6 (6a to 6e) and 6 (7a to 7d).

Figure 6A:
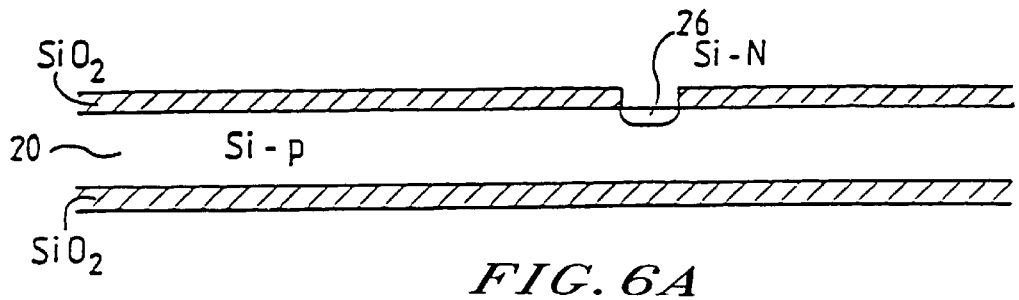
FIGS. 6 and 7 represent the successive steps of fabricating the upper silicon plate.

The upper plate 20 is oxidized on both its faces, an opening is formed in the oxide of the upper face in order to define the temperature-compensation diode, and the area of silicon 26 thus uncovered is doped, for example with phosphorous (FIG. 6a).

Figure 6B:
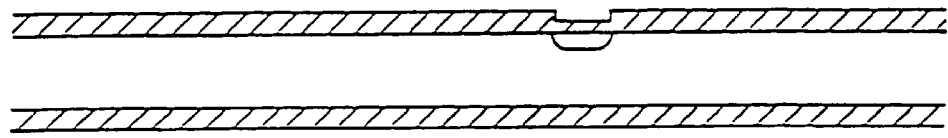

The area 26 is oxidized during or after the doping operation (FIG. 6b).

Figure 6C:
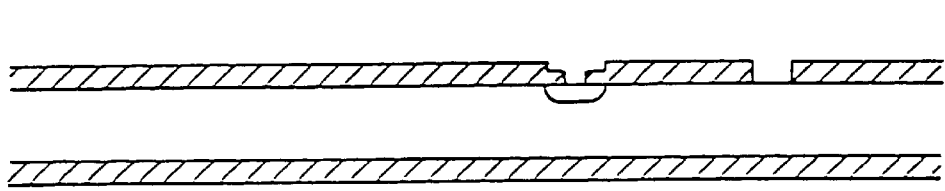

Two openings are photoetched in the oxide layer of the upper face, respectively an opening giving access to the diode and an opening for the metallization 22 giving access to the plate (FIG. 6c).

Figure 6D:
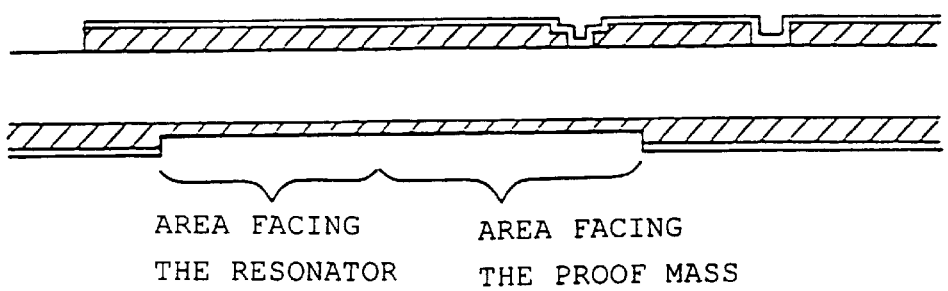

The two faces of the plate are covered with silicon nitride, and the nitride of the lower face is photoetched to define the areas of silicon which are to be hollowed in order to take them further away from the central plate with a view to reducing the stray capacitances between the central plate and the upper plate; in these areas, as well as in the area 21 which will face the resonant beam, the silicon oxide is removed through only part of its thickness (FIG. 6d). On the upper face, the oxide is removed through its full thickness on only one edge of the plate.

Figure 6E:
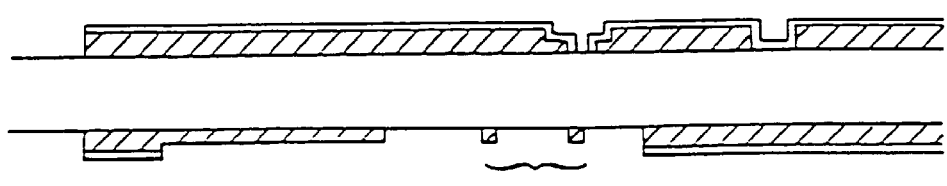

On the lower face of the plate 20 the oxide undergoes a photoetching operation and is removed, on the one hand, facing the proof mass, except where it is necessary to define upper stops 23, 24, and on the other hand on the edge of the plate; it is not removed in the area which will face the resonant beam (FIG. 6e).

Figure 7A:
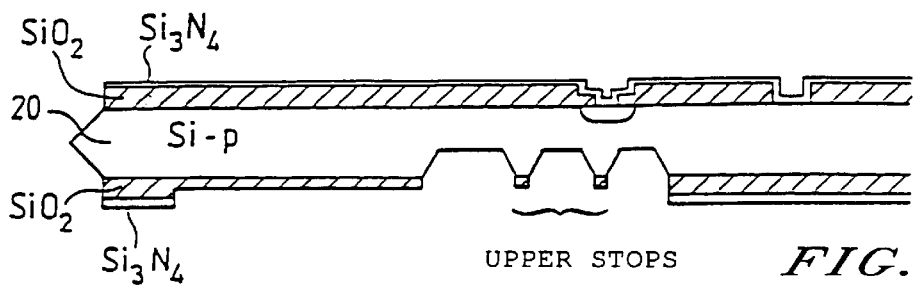

The silicon is attacked chemically where it is exposed, namely on the edge of the plate (on both faces) and, on the lower face, in the area located facing the proof mass apart from the stops 23, 24 which are thus produced (FIG. 7a).

Figure 7B:
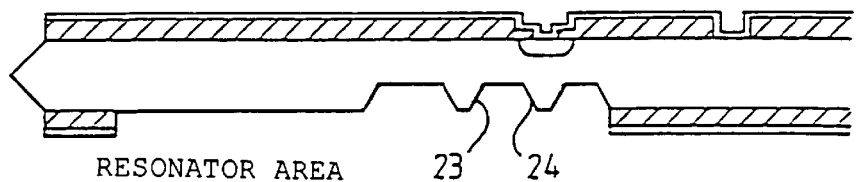

The silicon oxide remaining above the stops and in the area facing the resonant beam is removed (FIG. 7b).

Figure 7C:
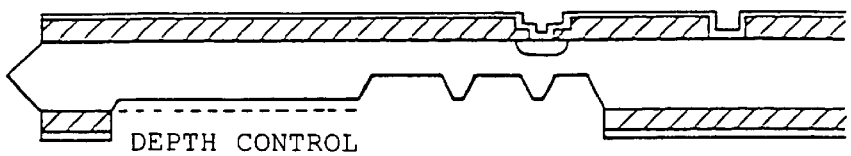

An additional silicon etch is carried out in the areas where the silicon remains exposed, which makes it possible for the spacing between the upper plate and the central plate to be controlled properly at the location of the resonant beam. The controlling of this spacing is in fact an important parameter for the quality of the sensor (FIG. 7c).

Figure 7D:
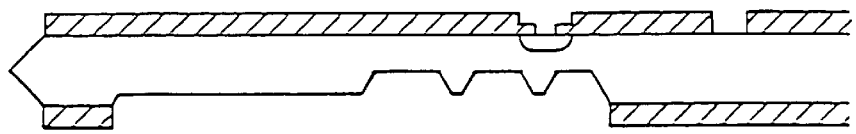

Lastly, the silicon nitride is removed on both faces and the upper face is ready to be welded to the central plate (FIG. 7d).

Central plate 30:

The operations relating to the central plate alone are described with reference to FIGS. 8 (8a to 8d), 9 (9a to 9d), [lacuna] (10a to 10d).

To make the explanations of the fabrication process easier, it has been assumed in these figures that the following areas are juxtaposed, even though they are not in reality side by side: base 37 of the proof mass; resonator 32, suspension arm 33, proof mass 31, physical separation area between active part 36 and spacer frame 35 and lastly spacer frame 35 itself.

Figure 8A:
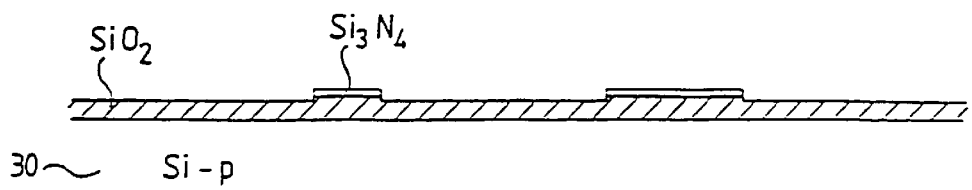
FIGS. 8, 9 and 10 represent the successive steps of fabricating the central silicon plate.

The silicon oxide layer is grown on both faces of the central plate 30, and a silicon nitride layer is deposited on the upper face which is etched to leave silicon remaining only in the areas corresponding to the resonant beam 32 and to the proof mass 31 (FIG. 8a).

Figure 8B:
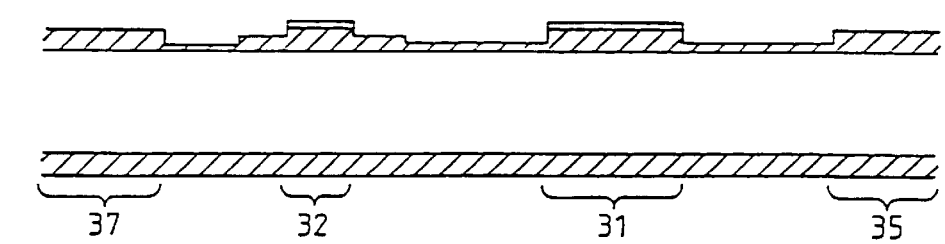

The exposed silicon oxide is photoetched (resin mask) on the upper face to make it possible to reduce its thickness almost everywhere except on the side edges of the resonant beam, on the base 37, and on the spacer frame 35 (FIG. 8b).

Figure 8C:
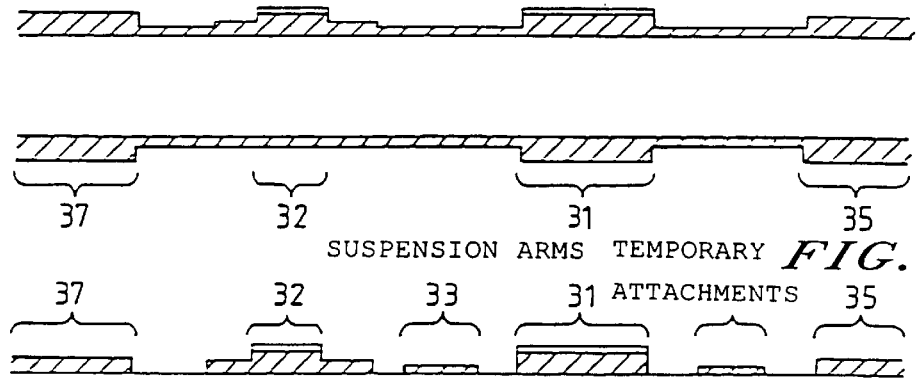

Similarly, on the lower face, the silicon oxide is photoetched in order to reduce its thickness everywhere except at the location of the proof mass, the base 37 and the spacer frame 35 (FIG. 8c).

Figure 8D:

A mask for photoetching the silicon oxide is put in place on the upper face in order to define a protective pattern for the silicon above the suspension arms 33, 34 and the temporary attachments between the frame 35 and the rest of the central plate, which attachments will be eliminated after the central plate has been assembled with the lower plate. The silicon oxide is removed through a thickness of a few tenths of micrometers in order to expose the silicon on the upper face of the central plate, with the exception of the following areas where it remains protected by the oxide: spacer frame 35, resonant beam 32 and side edges on either side of the beam, proof mass, suspension arm 33, temporary attachment 35'. (FIG. 8d).

Similarly, a mask for photoetching the silicon oxide is put in place on the lower face, identical to that of the upper face with the exception of the fact that the silicon does not need to be protected below the resonant beam 32 or on its edges. The silicon oxide is removed in order to expose the silicon except at the location of the frame 35, its temporary attachments, the proof mass, and the suspension arms 33 (FIG. 9a).

Figure 9A:
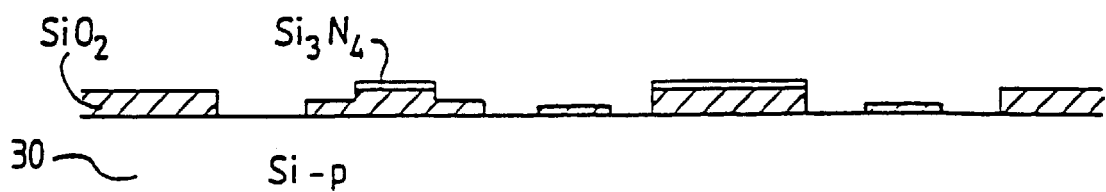
Figure 9B:
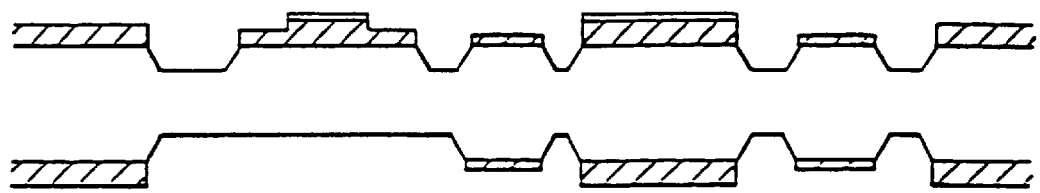

The silicon is etched by chemical attack on both faces at the same time, in order to start the etching where it is exposed (FIG. 9b).

Figure 9C:
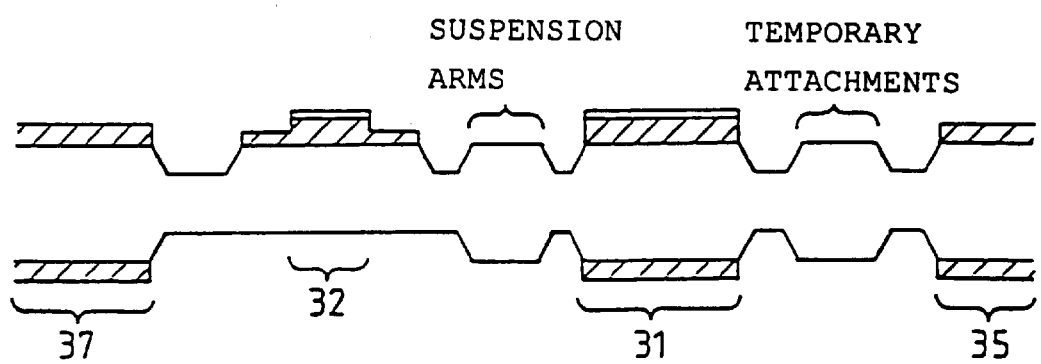

The small thickness of oxide remaining facing the temporary attachments and the suspensions arms, on the lower face and the upper face, is then removed; the oxide remains elsewhere (FIG. 9c).

Furthermore, the etching of the silicon is continued until the silicon is completely removed where it was completely exposed in the step of FIG. 9a. Since the attack on the silicon takes place both from above and from below, a configuration is left in which the silicon remains:

with its full thickness at the location of the base 37, the frame 35 on the proof mass 31, with a thickness substantially half that of the initial plate under the resonator beam 32, including its side edges, with a small thickness (about ten micrometers) for the suspension arms 33 and the temporary attachments denoted by 35'.

Figure 9D:
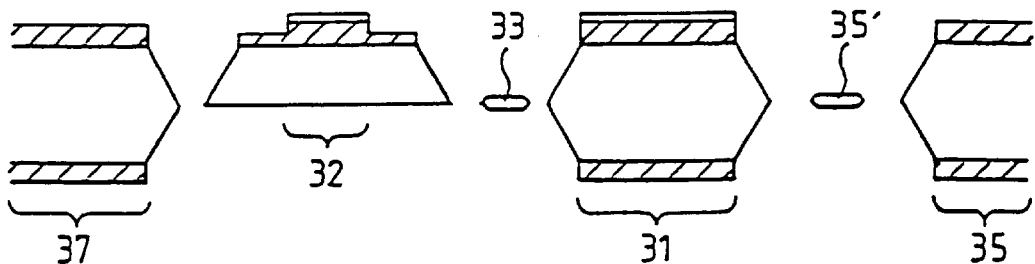

(FIG. 9d)

Figure 10A:
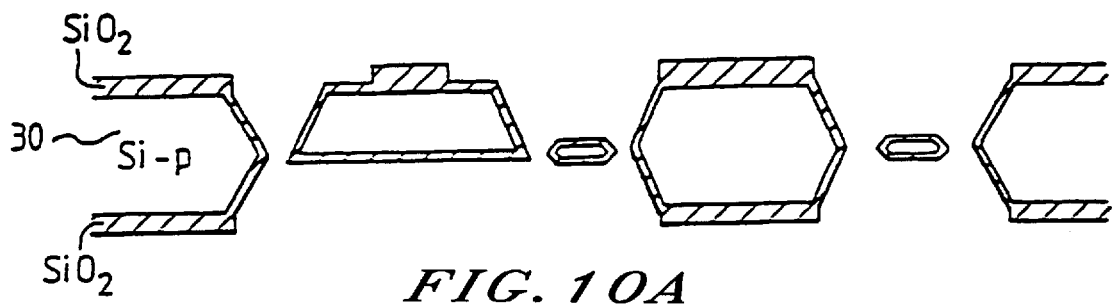

The silicon nitride still present on the upper face is then removed, and at this stage an operation of thin reoxidation of the exposed silicon on both faces is carried out. This leads to a thin silicon oxide layer on the bottom and the sides of the resonant beam, and on the bottom and the sides of the suspension arms and of the temporary attachments (FIG. 10a).

Figure 10B:
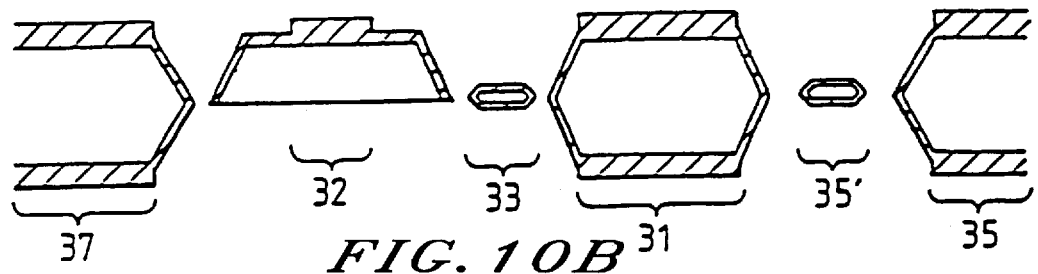

The thin oxide which has just been formed is then removed, by vertical directional etching starting from the lower face, through a mask which leaves uncovered only the silicon of the resonant beam and the side edges which frame it. This exposes the rear face of this beam, including these edges (FIG. 10b).

Figure 10C:
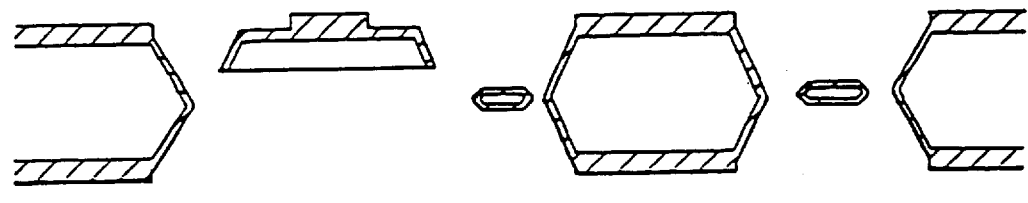

The silicon can then again be attached to give the resonant beam the desired final thickness (FIG. 10c).

Figure 10D:
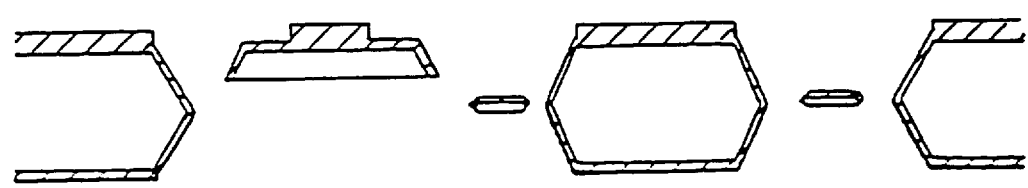

The next step consists in removing a portion of the thickness of the oxide present on the lower face, by vertical directional etching upwards, which removes the oxide under the suspension arms and under the temporary attachments 35', but without continuing the etching sufficiently to remove the oxide underneath the spacer frame 35 and the proof mass 31 (FIG. 10d).

Figure 10E:
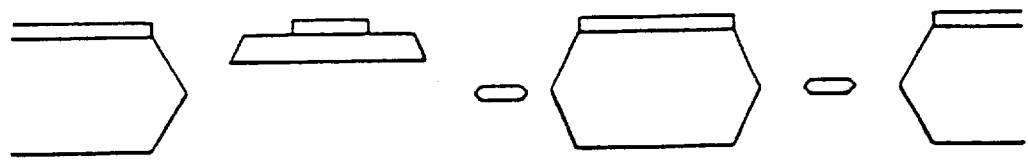

A portion of the thickness of the oxide present on the upper face is then removed, by vertical directional etching downwards, leaving oxide remaining only where it was the thickest, namely on the spacer frame 35, on the proof mass 31 and on the resonant beam 32, but not on the edges of the latter (FIG. 10e).

The next steps, which are represented in FIGS. 11 (11a to 11d) and 12 (12a to 12c), relate to the assembling of the plates and the operations carried out after assembly.

Figure 11A:
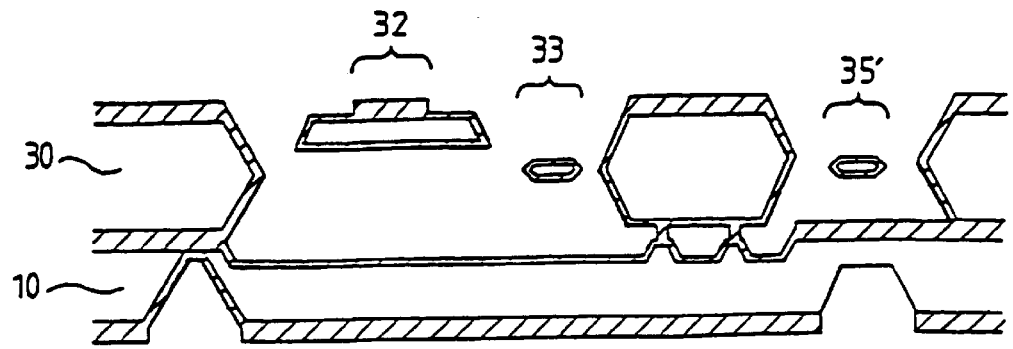
FIG. 11 represents the steps carried out once the lower plate and the central plate have been assembled together.

Assembling the central plate on the lower plate:

The central plate 30 is placed in contact via its lower face with the upper face of the lower plate 10, and the assembly is subjected to oxidizing anneal followed by an anneal in a neutral atmosphere. The plates become welded together and the exposed silicon parts become covered with a thin layer of silicon oxide (FIG. 11a).

Figure 11B:
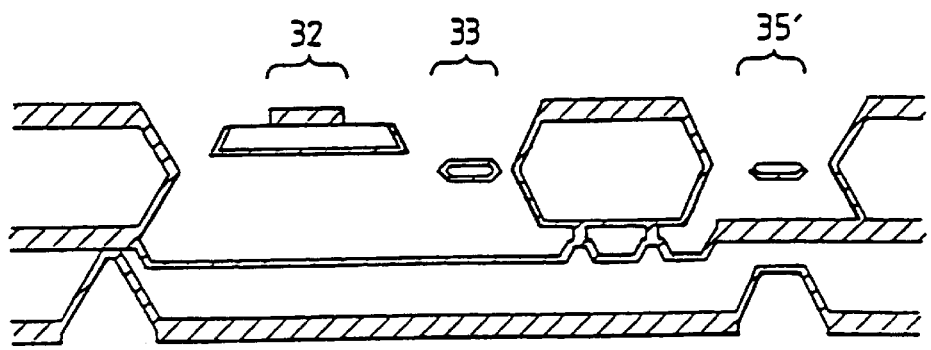

In the presence of a mask, by vertical directional etching, the thin silicon oxide on the horizontal portion of the side edges of the resonant beam 32 and on the temporary attachments 35' is removed, without exposing the silicon on the base 37, the frame 35, the beam 32, the arm 33 and the proof mass 31. Other elements of the lower plate can be exposed if the silicon needs to be etched in the next step. The suspension arms 33 remain protected in all cases (FIG. 11b). It will be understood that the selective removal of the oxide covering the side edges of the beam 32 is possible owing to the differences in oxide thickness which are present at this stage, but that this selective removal would also be possible if the beam 32 were covered at this stage with a material other than silicon oxide, for example nitride.

It will be noted that the use of a mask for etching the thin silicon oxide is possible at this stage because the proof mass is held in place in contact with the oxide covering the stops 11, 12. In this way, the fragile areas of the silicon (beam, suspension arms) are not subjected to severe stresses. This etching mask would be virtually unusable in the central plate before assembling with the lower plate.

Figure 11C:
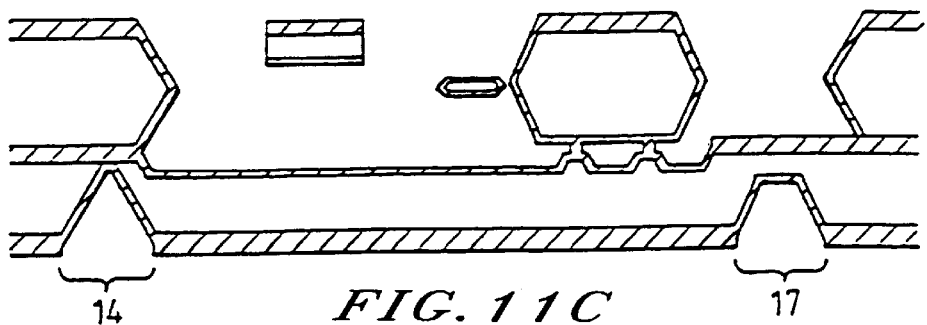

Etching of the silicon is then carried out in order to eliminate the side edges of the resonant beam 32 and thus give it its definitive width. The temporary attachments 35' are eliminated at the same time (FIG. 11c). The etching is preferably a vertical directional etch (using plasma) but it may also be a nondirectional chemical etch; in the latter case, the width of the arm defining the beam 32 needs to take account of the slight under-etching resulting from the chemical attack.

Figure 11D:
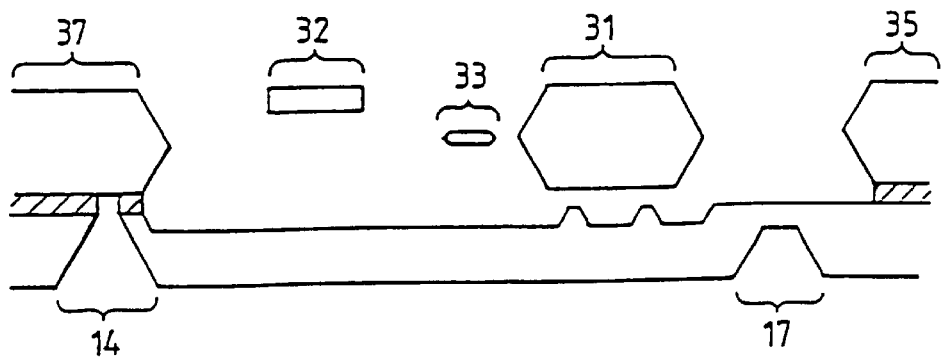

The assembly of the two plates is subjected to a partial deoxidation operation which eliminates the oxide everywhere (without eliminating the oxide under the spacer frame 35 and under the base 37 at the junction of the welded plates). During this operation, the oxide present between the stops 11, 12 and the proof mass is eliminated because of the narrowness of the stops. The oxides present at the bottom of the openings 14 and 17 is also eliminated, and at the etching of the oxide is continued until the silicon of the central plate is exposed in the bottom of the opening 14. At the end of this operation, there is no longer any oxide on the active parts of the central plate, that is to say on the proof mass, the beam and the suspension arms (FIG. 11d).

At this stage, the resonant beam 32 has its definitive dimensions, both in width and in thickness. The same is true as regards the suspension arms 33 and the proof mass 31.

Figure 12A:
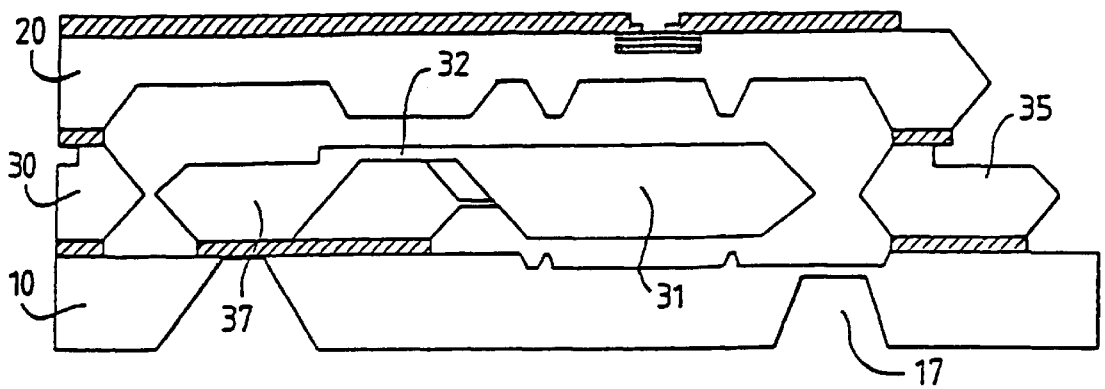
FIG. 12 represents the final steps when all three plates are assembled together.

Assembling the three plates together:

The upper plate is then attached to the central plate by welding under vacuum at about 1,000° C. The welding under vacuum makes it possible immediately to create the vacuum in the closed cavity containing the proof mass and the resonant beam. The opening 17 is still closed at this stage by a certain residual thickness of silicon (FIG. 12a).

It will be noted that FIG. 12 represents the true configuration of the sensor, that is to say the various parts are placed close relative to one another at their real functional location, contrary to what was done in order to describe the previous operations.

Figure 12B:
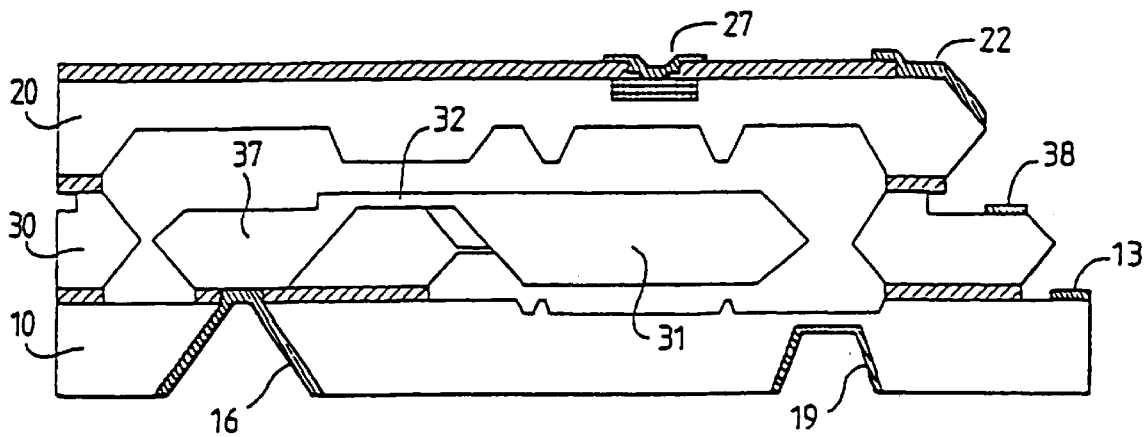

After surface deoxidation of the contact areas on the silicon, a metal deposit is made by evaporation on the external faces of the sensor, then etching is carried out to delimit the contacts and metal deposits to be left on each plate: contacts 22 and 27 on the upper plate, optional connection to bring the contact 27 onto the edge of the plate; contact 38 on the central plate; contact 13 on the lower plate;

contact 16 on the central plate through the opening 14 in the lower plate. All these contacts may be in vacuum-evaporated aluminium. A separate chromium-gold alloy deposit 19 may also be made in the opening 17, in preparation for a subsequent indium weld (FIG. 12b).

At this stage, the sensor can be tested by a point test, while having its cavity closed and under vacuum, which is very important.

Figure 12C:
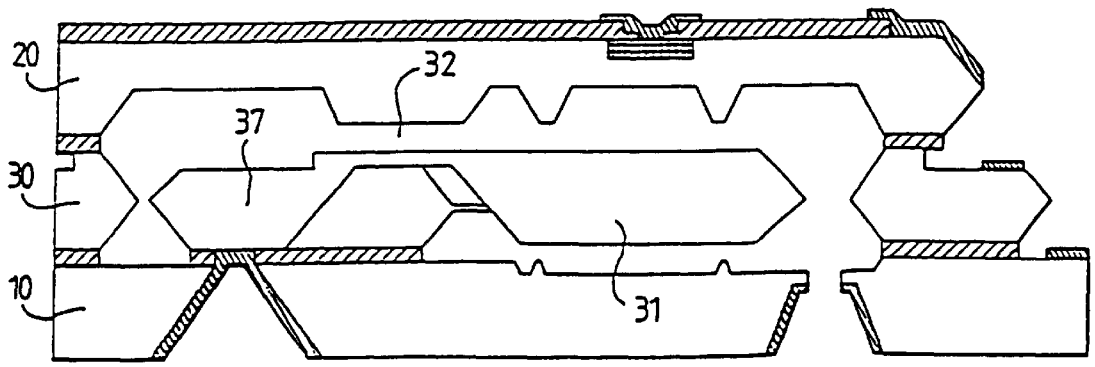

The next operation is to pierce the silicon membrane closing the opening 17. The piercing is carried out by laser (FIG. 12c).

The cavity is then closed by an indium bead under vacuum, in order to obtain the structure represented in FIG. 1. A point test can still be carried out at this stage.

The fabrication operations have been described with reference to an accelerometer, but adaptation to other types of sensors is straightforward. The difference would, typically, be the following for a pressure sensor: there is no suspended proof mass and the resonant beam is attached between two fixed bases such as the base 37. The lower plate is thinned greatly in the region separating these two bases, and the deformations of the plate due to the external pressure have the effect of creating a tensile stress on the resonant beam. The fabrication operations would overall be the same, especially those regarding the thickness and width machining of the resonant beam.

What is claimed is:

1. Process for micromachining a beam of a microsensor having at least two plates, at least the first of which is in micromachined silicon, comprising the steps of:

micromachining the silicon on the first plate to produce a beam having a thickness equal to a desired final thickness, and a width greater than a desired final width, the beam being covered on an upper face of the beam by a mask defining the desired final width;

assembling the at least two plates together;

oxidizing the upper face and a lower face of the beam in order to cover the upper and lower faces with a thin protective layer;

removing the thin protective layer on the upper face, by vertical directional etching, without removing the mask already present;

etching the silicon in an area of the upper face exposed by the preceding removing step until an entire part of the beam not protected by the mask is eliminated and the beam having the desired final width is thus formed.

2. Process according to claim 1, wherein the etching the silicon step is performed by a vertical directional etch.

3. Process according to claim 1, wherein, before the plates are assembled together, the micromachining step comprises:

depositing a first layer which protects against etching of the silicon over the width greater than the desired final width, the first layer being thicker over a width corresponding to the desired final width, wherein the first layer constitutes the mask where the first layer is thicker;

attacking the silicon through both the upper face and the lower face in one or more steps, until the beam is given the desired final thickness;

removing the first layer on edges of the beam on either side of the desired final width, while keeping the portion of the first layer as the mask having the desired final width.

4. Process according to claim 3, applied to production of an accelerometer having a proof mass connected to a base by the beam and by suspension arms located in a median plane of the thickness of the first plate, comprising the steps of:

performing a first silicon attack through both the upper face and the lower face in a first step until the suspension arms have reached a desired thickness and oxidizing the suspension arms in order to protect the suspension arms; and performing a second silicon attack in a second step without attacking the suspension arms thus protected.

5. Process according to claim 1, further comprising the steps of:

micromachining the first plate to define a peripheral spacer frame completely separated from an active part inside the frame, the beam forming part of the active part; and separating the frame from the active part by removing the silicon during the etching the silicon step which gives the beam the desired final width.

6. Process according to claim 2, wherein, before the plates are assembled together, the micromachining step comprises:

depositing a first layer which protects against etching of the silicon over the width greater than the desired final width, the first layer being thicker over a width corresponding to the desired final width, wherein the first layer constitutes the mask where the first layer is thicker;

attacking the silicon through both the upper face and a lower face in one or more steps, until the beam is given the desired final thickness;

removing the first layer on edges of the beam on either side of the desired final width, while keeping the portion of the first layer as the mask having the desired final width.

7. Process according to claim 6, applied to production of an accelerometer having a proof mass connected to a base by the beam and by suspension arms located in a median plane of the thickness of the first plate, comprising the steps of:

performing a first silicon attack through both the upper face and the lower face in a first step until the suspension arms have reached a desired thickness and oxidizing the suspension arms in order to protect the suspension arms; and performing a second silicon attack in a second step without attacking the suspension arms thus protected.

8. Process according to claim 2, further comprising the steps of:

micromachining the first plate to define a peripheral spacer frame completely separated from an active part inside the frame, the beam forming part of the active part; and separating the frame from the active part by removing the silicon during the etching the silicon step which gives the beam the desired final width.

9. Process according to claim 3, further comprising the steps of:

micromachining the first plate to define a peripheral spacer frame completely separated from an active part inside the frame, the beam forming part of the active part; and separating the frame from the active part by removing the silicon during the etching the silicon step which gives the beam the desired final width.

10. Process according to claim 4, further comprising the steps of:

micromachining the first plate to define a peripheral spacer frame completely separated from an active part inside the frame, the beam forming part of the active part; and separating the frame from the active part by removing the silicon during the etching the silicon step which gives the beam the desired final width.

* * * * *

UNITED STATES PATENT AND TRADEMARK OFFICE
CERTIFICATE OF CORRECTION

PATENT NO. : 6,251,698 B1  
DATED : June 26, 2001  
INVENTOR(S) : Lefort et al.

Page 1 of 1

It is certified that error appears in the above-identified patent and that said Letters Patent is hereby corrected as shown below:

<u>Title page,</u>
Item [86], the Filing Date is incorrect. Item [86] should read as follows:
[86]   PCT No.:       PCT/FR98/00998
       § 371 Date:    Nov. 23, 1999
       § 102(e) Date: Nov. 23, 1999

Signed and Sealed this

Fifteenth Day of January, 2002

*Attest:*

JAMES E. ROGAN
*Attesting Officer*   *Director of the United States Patent and Trademark Office*